(12) United States Patent
Ohyama et al.

(10) Patent No.: US 12,363,867 B2
(45) Date of Patent: Jul. 15, 2025

(54) ELECTRONIC APPARATUS AND HEAT TRANSPORT DEVICE

(71) Applicant: Lenovo (Singapore) Pte. Ltd., Singapore (SG)

(72) Inventors: Atsushi Ohyama, Kanagawa (JP); Tsunenori Yanagisawa, Kanagawa (JP); Mizuki Itoyama, Kanagawa (JP); Akinori Uchino, Kanagawa (JP)

(73) Assignee: Lenovo (Singapore) Pte. Ltd., Singapore (SG)

( * ) Notice: Subject to any disclaimer, the term of this patent is extended or adjusted under 35 U.S.C. 154(b) by 177 days.

(21) Appl. No.: 18/305,827

(22) Filed: Apr. 24, 2023

(65) Prior Publication Data

US 2023/0354553 A1 Nov. 2, 2023

(30) Foreign Application Priority Data

Apr. 27, 2022 (JP) .................................. 2022-073346

(51) Int. Cl.
  *H05K 7/20* (2006.01)
  *G06F 1/20* (2006.01)

(52) U.S. Cl.
  CPC ......... *H05K 7/20336* (2013.01); *G06F 1/203* (2013.01); *G06F 1/206* (2013.01)

(58) Field of Classification Search
  CPC ......... G06F 2200/201; G06F 2200/203; G06F 1/1616; G06F 1/1681; G06F 1/206; G06F 1/20; H01L 23/427; H01L 23/34; H01L 23/473; F28D 15/046; F28D 15/0241; F28D 15/04; F28D 2021/0028; H05K 7/20336; H05K 7/2039; H05K 7/2099; H05K 1/0203; H05K 7/20; H01M 10/6552

See application file for complete search history.

(56) References Cited

U.S. PATENT DOCUMENTS 5,757,615 A * 5/1998 Donahoe ................. G06F 1/203
                                              361/679.48
6,324,055 B1   11/2001 Kawabe
(Continued)

FOREIGN PATENT DOCUMENTS

JP   H09-326577 A   12/1997
JP   2000-010661 A   1/2000
(Continued)

OTHER PUBLICATIONS

Heat Dissipation Panel, Heat Dissipation Device and Electronic Apparatus; Yang et al. EP3531811 (Year: 2019).*
(Continued)

*Primary Examiner* — Michael A Matey
(74) *Attorney, Agent, or Firm* — Osha Bergman Watanabe & Burton LLP (57) ABSTRACT

An electronic apparatus includes a first chassis which loads a processing device, a second chassis which is coupled with the first chassis to be rotatably movable relative to each other and a vapor chamber which has a first flexile resin sheet, a second flexible resin sheet and a closed space which is formed between the first resin sheet and the second resin sheet and in which a working fluid is encapsulated, extends from the inside of the first chassis to the inside of the second chassis and transports heat that the processing device generates to the second chassis side.

6 Claims, 6 Drawing Sheets

(56) References Cited

U.S. PATENT DOCUMENTS

| | | | |
|---|---|---|---|
| 2018/0284856 A1* | 10/2018 | Shah | G06F 1/1616 |
| 2018/0347921 A1 | 12/2018 | Morrison et al. | |
| 2019/0354148 A1* | 11/2019 | Delano | G06F 1/203 |
| 2020/0326134 A1* | 10/2020 | Chen | H01L 23/427 |
| 2022/0159881 A1* | 5/2022 | Watanabe | G06F 1/206 |
| 2023/0156968 A1* | 5/2023 | Chen | H05K 7/20263 |
| | | | 165/104.26 |
| 2024/0159473 A1* | 5/2024 | Wang | F28D 15/0233 |

FOREIGN PATENT DOCUMENTS

| | | |
|---|---|---|
| JP | 2004-012011 A | 1/2004 |
| JP | 2006-216878 A | 8/2006 |
| JP | 2007-183021 A | 7/2007 |
| JP | 2015-018993 A | 1/2015 |
| JP | 2022-019634 A | 1/2022 |
| JP | 2022-030431 A | 2/2022 |

OTHER PUBLICATIONS

Extended European Search Report issued in corresponding European Patent Application No. 23161076.7, dated Sep. 26, 2023 (11 pages).

* cited by examiner

ELECTRONIC APPARATUS AND HEAT TRANSPORT DEVICE

CROSS-REFERENCE TO RELATED APPLICATIONS

This application claims priority to Japanese Patent Application No. 2022-73346 filed on Apr. 27, 2022, the contents of which are hereby incorporated herein by reference in their entirety.

BACKGROUND OF THE INVENTION

Field of the Invention

The present invention relates to an electronic apparatus and a heat transport device.

Description of the Related Art

An electronic apparatus such as a laptop PC has such a configuration that a chassis which loads a motherboard and a battery device and a chassis which loads a display are coupled together via a hinge (see, for example Japanese Unexamined Patent Application Publication No. 2022-030431).

In an electronic apparatus of the type that two chassis are coupled together to be rotationally movable relative to each other, a difference in temperature sometimes occurs between one chassis which loads the motherboard and so forth and the other chassis. In general, there is a tendency that the calorific value in the motherboard-loaded-side chassis that a processing device such as a CPU and so forth are implemented is remarkably increased more than the calorific value in the other chassis.

However, the electronic apparatus of the above-mentioned type is highly requested to miniaturize and thin the chassis and therefore it is difficult to load a large-sized cooling device which is high in cooling capacity on the electronic apparatus of the above-mentioned type. Accordingly, it is also requested to the electronic apparatus of the above-mentioned type to cool the inside of a high-temperature-side chassis by transporting heat in the high-temperature-side chassis to the inside of the low-temperature-side chassis. However, in this case, it is preferable for a heat transport device to have flexibility which is sufficient to follow mutual rotational moving operations between the chassis.

On the other hand, in the electronic apparatus of the above-mentioned type, there are cases where a flexible substrate is so installed as to extend from one chassis to the other chassis. However, a space which is used for installation of a member between the chassis is limited. Accordingly, in the electronic apparatus of the above-mentioned type, in a case where the above-described heat transport device is so installed as to extend from one chassis to the other chassis in addition to the flexible substrate, also securing of a space for installation of the heat transport device becomes a problem.

SUMMARY OF THE INVENTION

The present invention mainly aims to provide an electronic apparatus and a heat transport device which make highly efficient heat transportation possible between the chassis which rotationally move relative to each other. The present invention also aims to provide the electronic apparatus and the heat transport device which make it possible to secure the space for installation of the flexible substrate and the heat transport device which are so installed as to extend from one chassis to the other chassis which rotationally move relative to each other.

An electronic apparatus according to the first aspect of the present invention includes a first chassis which loads a processing device, a second chassis which is coupled with the first chassis to be rotatably movable relative to each other and a vapor chamber which has a first flexile resin sheet, a second flexible resin sheet and a closed space which is formed between the first resin sheet and the second resin sheet and in which a working fluid is encapsulated, extends from the inside of the first chassis to the inside of the second chassis and transports heat that the processing device generates to the second chassis side.

A heat transport device according to the second aspect of the present invention includes a vapor chamber which has a first flexible resin sheet, a second flexible resin sheet and a closed space which is formed between the first resin sheet and the second resin sheet and in which a working fluid is encapsulated and a flexible substrate which has the second resin sheet and a third resin sheet which is laminated on the second resin sheet with metal wiring being interposed between the second and the third resin sheets and which is configured to be integrated with the vapor chamber by sharing the second resin sheet with the vaper chamber.

According to the above-described aspects of the present invention, it becomes possible to miniaturize and thin the chassis of the electronic apparatus and thereby to improve the quality of the external appearance of the electronic apparatus.

DETAILED DESCRIPTION OF THE INVENTION

In the following, an electronic apparatus and a heat transport device pertaining to the present invention will be described in detail by giving favorable embodiments while referring to the appended drawings.

Figure 1:
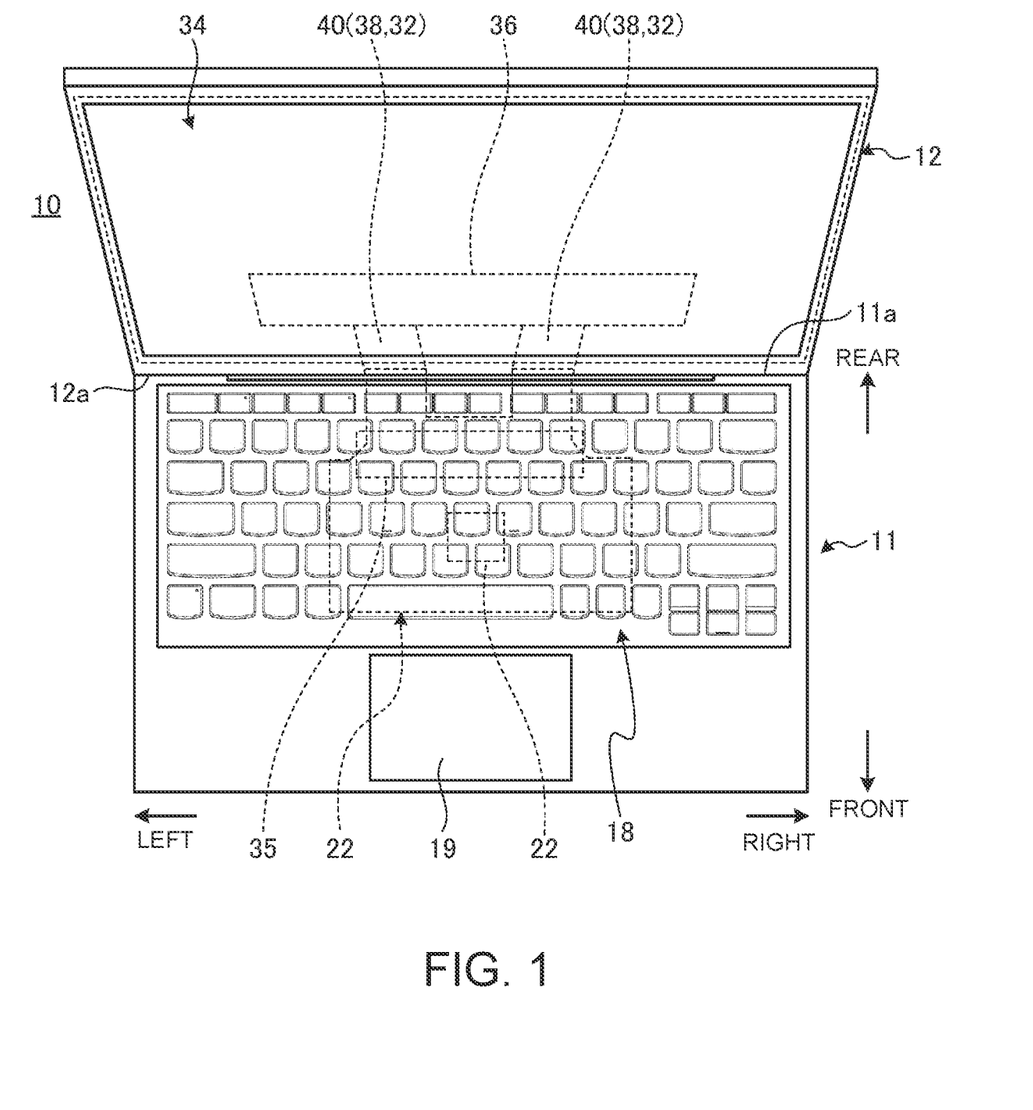
FIG. 1 is a schematic plan view illustrating one example of a state that an electronic apparatus according to the first embodiment of the present invention is viewed from above.

FIG. 1 is a schematic plan view illustrating one example of a state that an electronic apparatus 10 according to the first embodiment of the present invention is viewed from above.

As illustrated in FIG. 1, the electronic apparatus 10 is a clamshell-type laptop PC that a first chassis 11 and a second chassis 12 are so coupled together as to be rotationally movable relative to each other by using a hinge 16. In the electronic apparatus 10, the chassis 11 and 12 are made rotationally movable relative to each other from a 0-degree posture up to, for example, a 180-degree posture (see FIG. 2 and FIG. 3A), exceeding a 90-degree posture (see FIG. 3B). The chassis 11 and 12 are mutually laminated in a state that the electronic apparatus 10 takes the 0-degree posture and are arranged side by side adjacently to each other in a direction which is vertical to a surface normal direction in a state that the electronic apparatus 10 takes the 180-degree posture. A range that the chassis 11 and 12 mutually move rotationally may be either less than the 180-degrees or more than the 180-degrees. The electronic apparatus pertaining to the present invention may be, for example, a foldable-type PC which is equipped with a foldable organic EL (electroluminescence) display, a smartphone, a portable gaming machine and so forth.

In the following, the electronic apparatus 10 will be described with a state that the second chassis 12 is opened relative to the first chassis 11 and thereby the electronic apparatus 10 takes the 180-degree posture (see FIG. 2 and FIG. 3A) being set as a reference and calling the near side as "front", the back side as "rear", a width direction as a left-right direction and a thickness direction as an up-down direction.

First, the entire configuration of the electronic apparatus 10 will be described.

Figure 2:
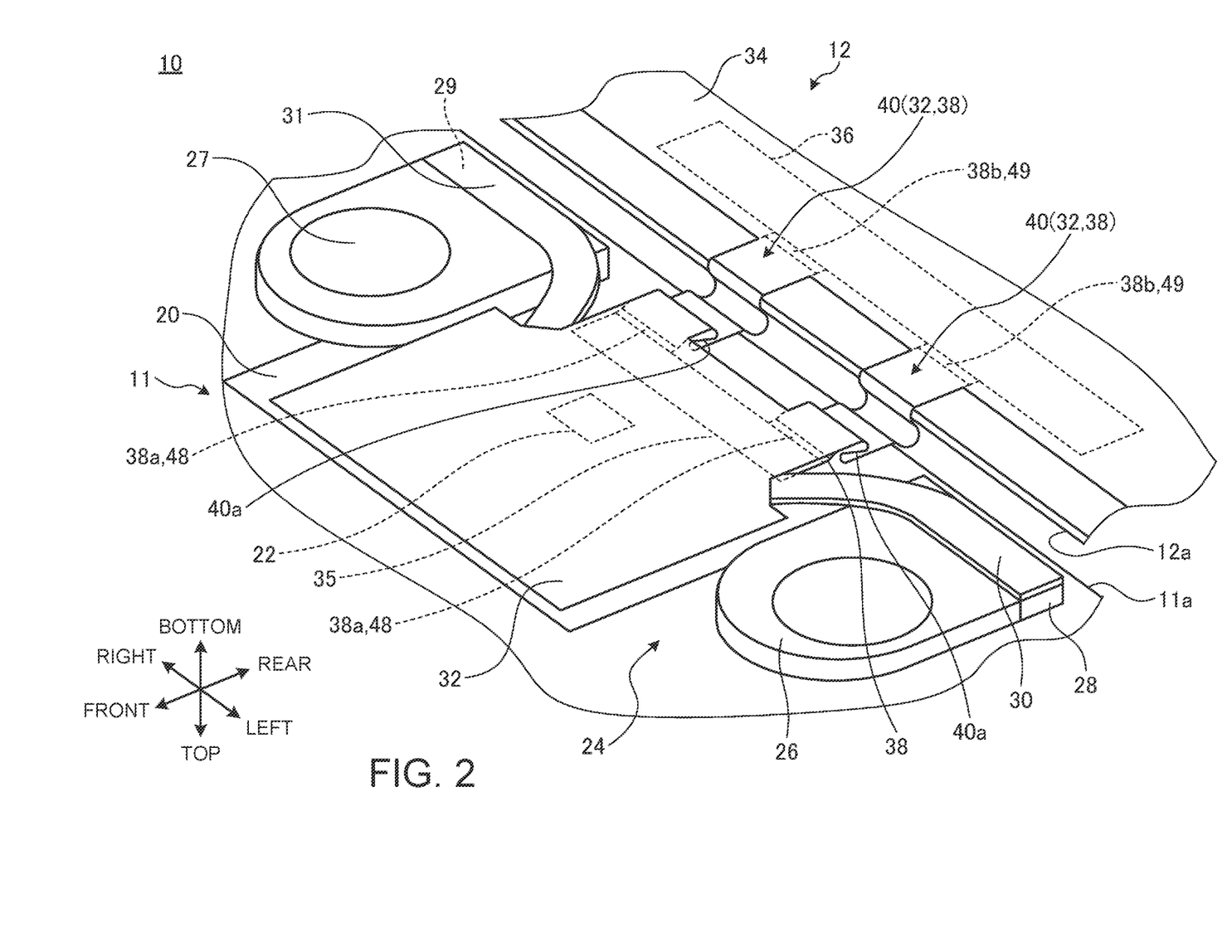
FIG. 2 is a schematic perspective view illustrating one example of an internal structure of the electronic apparatus in a state of viewing the electronic apparatus from below with chassis being mutually opened to the angle of 180 degrees.

FIG. 2 is a schematic perspective view illustrating one example of an internal structure of the electronic apparatus 10 in a state that the chassis 11 and 12 are mutually opened to the 180 degrees and are viewed from below.

As illustrated in FIG. 1 and FIG. 2, the first chassis 11 is a flattened box body. A keyboard 18 and a touch pad 19 are installed on an upper face of the first chassis 11. Various electronic components such as a battery device, an antenna device and so forth are housed in the first chassis 11 in addition to a motherboard 20. Various chips such as an SSD (Solid State Drive), a memory and so forth are implemented on the motherboard 20, in addition to a CPU (Central Processing Unit) 22 which is a processing device.

Also, a cooling device 24 for cooling the CPU 22 is loaded in the first chassis 11. The cooling device 24 includes fans 26 and 27, fins 28 and 29, heat pipes 30 and 31 and a vapor chamber 32. The heat pipes 30 and 31 efficiently transmit heat that the CPU 22 generates to the fins 28 and 29 respectively. The fans 26 and 27 send air to the fins 28 and 29 respectively and discharge heat which is generated from the CPU 22 and is transported through the heat pipes 30 and 31 to the outside of the first chassis 11. The vapor chamber 32 has a flexible sheet structure and is so installed as to extend from the chassis 11 to the chassis 12 and details of the vapor chamber 32 will be described later. In addition, the cooling device 24 may have such a configuration that some of or all the fans 26 and 27, the fins 28 and 29 and the heat pipes 30 and 31 are omitted.

As illustrated in FIG. 1 and FIG. 2, the second chassis 12 is a box body which is thinner and more flattened than the first chassis 11. A display 34 is installed on a front face of the second chassis 12. The display 34 is configured by, for example, an organic EL (OLED: Organic Light Emitting Diode) display, a liquid crystal display and so forth.

In the electronic apparatus 10, a display substrate 35 is loaded in the first chassis 11 and a relay substrate 35 is loaded in the second chassis 12. The display substrate 35 is a control substrate of the display 34 and is connected to the motherboard 20. The relay substrate 36 is adapted to relay electric signals which are transmitted and received between the display 34 and the display substrate 35, is connected to the display 34 and is installed on a back face of the display 34. In the electronic apparatus 10, the display substrate 35 and the relay substrate 36 are mutually connected via a flexible substrate (FPC: Flexible printed circuits) 38 which is so installed as to extend from the chassis 11 to the chassis 12.

The display substrate 35 may be also loaded in the second chassis 12. In this case, the display substrate 35 may be installed on the back face of the display 34 and installation of the relay substrate 36 may be omitted. In this case, the flexible substrate 38 may function to mutually connect the display substrate 35 in the second chassis 12 and the motherboard 20 in the first chassis 11.

The hinge 16 couples together adjacent edges 11a and 12a of the chassis 11 and 12. The adjacent edge 11a is a rear edge of the first chassis 11. The adjacent edge 12a is a front edge of the second chassis 12. In the first embodiment, the hinge 16 has one elongated structure which extends in the left-right direction. The hinges 16 may be also installed in the form of, for example, one pair of left and right hinges.

As illustrated in FIG. 2, in the electronic apparatus 10 according to the first embodiment of the present invention, the vapor chamber 32 and the flexible substrate 38 extend from the chassis 11 to the chassis 12. Accordingly, the vapor chamber 32 and the flexible substrate 38 are subject to repetitive bending deformation in association with mutual rotational moving operations between the chassis 11 and 12 via the hinge 16. Accordingly, in the first embodiment of the present invention, the vapor chamber 32 has a flexible sheet structure. Further, in the electronic apparatus 10, the vapor chamber 32 and the flexible substrate 38 which are so installed as to extend from the adjacent edge 11a of the chassis 11 to the adjacent edge 12a of the chassis 12 are so integrated as to promote thinning of the entire of the vapor chamber 32 and the flexible substrate 38 and thereby securing the installation space of the vapor chamber 32 and the flexible substrate 38.

In the following, description will be made by calling a configuration that the vapor chamber 32 is integrated with the flexible substrate 38 as a heat transport device 40 in a lump. Incidentally, it is also possible to mainly grasp the configuration that the vapor chamber 32 is integrated with the flexible substrate 38 not as the vapor chamber 32 but as the flexible substrate 38. In the above-mentioned case, there are also cases where it is appropriate to call this configuration not as the heat transport device 40 but as wiring 40.

Figure 3A:
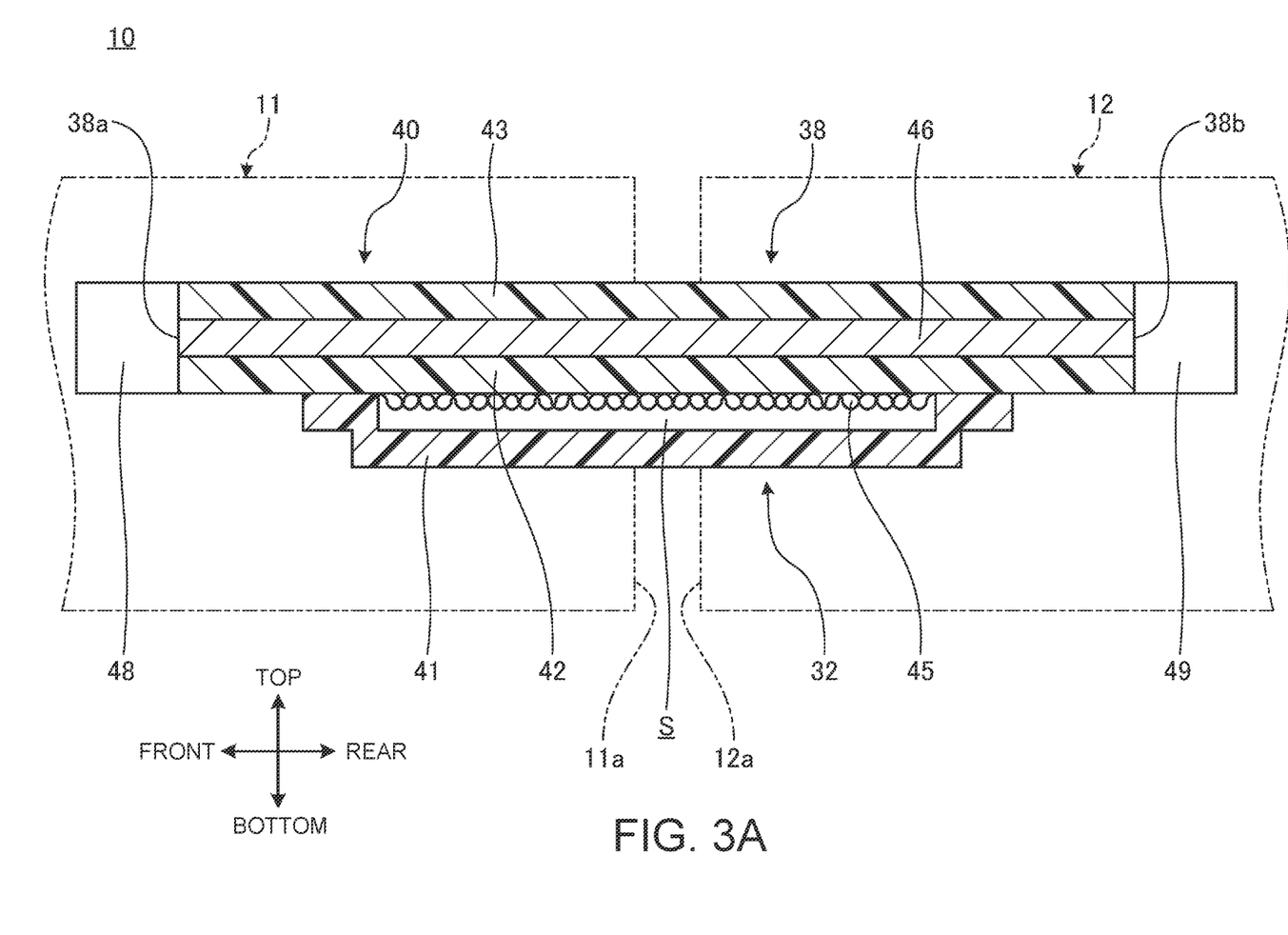
FIG. 3A is a schematic side sectional diagram illustrating one example of a heat transport device in a state that the electronic apparatus takes a 180-degree posture.
Figure 3B:
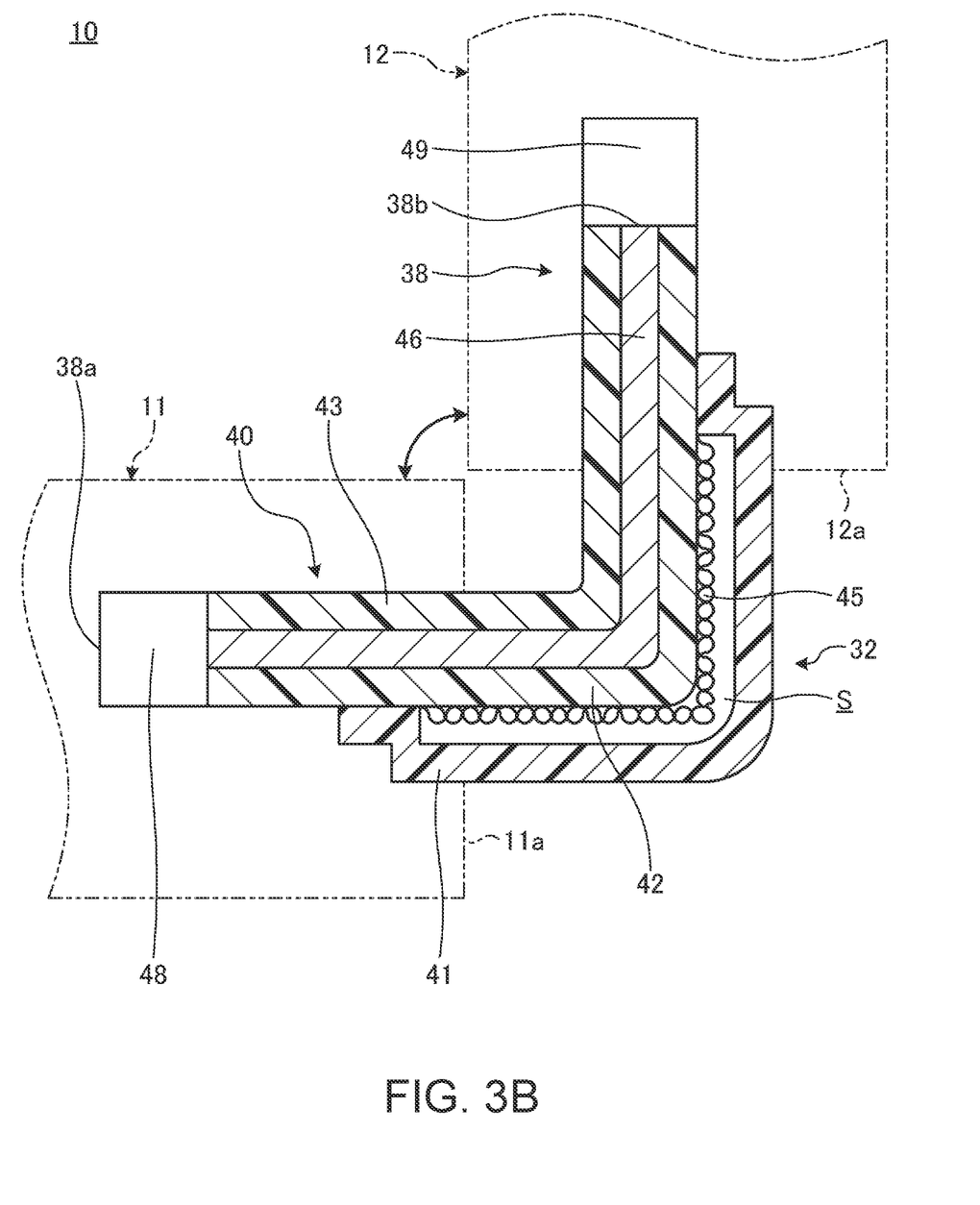
FIG. 3B is a schematic side sectional diagram illustrating one example of the heat transport device in a state that the posture of the electronic apparatus which is illustrated in FIG. 3A is shifted to a 90-degree posture.

FIG. 3A is a schematic side sectional diagram illustrating one example of the heat transport device 40 in a state that the electronic apparatus 10 takes the 180-degree posture. FIG. 3B is a schematic side sectional diagram illustrating one example of the heat transport device 40 in a state that the posture of the electronic apparatus 10 which is illustrated in FIG. 3A is shifted to a 90-degree posture.

As illustrated in FIG. 2 to FIG. 3B, the heat transport device 40 is configured such that the vapor chamber 32 is integrated with the flexible substrate 38.

First, the vapor chamber 32 has a first resin sheet 41, a second resin sheet 42 and a closed space S which is formed between the first resin sheet 41 and the second resin sheet 42. The vapor chamber 32 is a sheet-shaped heat transport device that a working fluid is encapsulated in the closed space S.

The resin sheets 41 and 42 are formed by using a resin material (a heat conduction resin) which has flexibility and thermal conductivity. As the materials which form the resin sheets 41 and 42, it is possible to give polyimide, polycarbonate, polybutylene terephthalate, polyacetal, nylon and so forth as examples of the materials which are used for formation of the resin sheets 41 and 42. In the first embodiment of the present invention, the resin sheets 41 and 42 are formed by using a polyimide sheet or film in consideration of high thermal conductivity, easiness of bending, electric insulation which is needed to form the flexible substrate 38 and so forth.

The closed space S serves as a flow path that the encapsulated working fluid flows while exhibiting a phase change. It is possible to give water, alternative freon, acetone, butane and so forth as examples of the working fluid. A wick 45 which sends the working fluid which is condensed with the aid of the capillary action is arranged in the closed space S. The wick 45 is formed into, for example, a meshed shape which is knitted of fine yarn in a cotton-like form. It is preferable that also the wick 45 be flexible. Accordingly, it is preferable that also the wick 45 be formed by using the resin material which is the same as the resin material of the resin sheets 41 and 42. However, since the flexibility of the wick 45 is obtained by the meshed shape, the wick 45 may be also formed by using a metal material.

Next, the flexible substrate 38 has the second resin sheet 42, a third resin sheet 43 and metal wiring 46. The flexible substrate 38 has a structure that the second resin sheet 42 is shared with the vapor chamber 32 and the third resin sheet 43 is laminated on a surface of the second resin sheet 42 with the metal wiring 46 being interposed between the second and third resin sheets 42 and 43. The third resin sheet 43 may be formed by using a resin material which is exactly the same as or is almost the same as the resin material of the resin sheets 41 and 42. In the present embodiment, the third resin sheet 43 is formed by using a polyimide sheet or film in the same manner as the resin sheets 41 and 42.

As described above, in the heat transport device 40 in the present embodiment, the vapor chamber 32 and the flexible substrate 38 are configured to be integrated with each other by sharing the central second resin sheet 42 between the vapor chamber 32 and the flexible substrate 38. Here, a thickness of each of the resin sheets 41 to 43 is, for example, about 0.05 mm. That is, it becomes possible to thin the heat transport device 40 by the amount which, at least, corresponds to the thickness of the second resin sheet 42 in comparison with a configuration that the vapor chamber 32 and the flexible substrate 38 which are configured as mutually separated elements are simply laminated. Specifically, the plate thickness of the vapor chamber is, for example, about 0.2 to 0.25 mm and the plate thickness of the flexible substrate 38 is, for example, about 0.1 to 0.2 mm. Accordingly, it becomes possible to make the plate thickness of the heat transport device 40 extremely thin, that is, on the order of, for example, about 0.25 to 0.4 mm and thereby it becomes possible to obtain high flexibility which would be sufficiently durable to repetitive bending (see FIG. 3A and FIG. 3B).

As illustrated in FIG. 2 to FIG. 3B, in the heat transport device 40, for example, terminals 48 and 49 are respectively attached to ends 38a and 38b of the flexible substrate 38. The terminal 48 is connected to the display substrate 35, for example, in the first chassis 11. The terminal 49 is connected to the relay substrate 36, for example, in the second chassis 12. As described above, in a configuration that the display substrate 35 is arranged in the second chassis 12, it is preferable that one of the terminals 48 and 49 be connected to the motherboard 20 in the first chassis 11 and the other of the terminals 48 and 49 be connected to the display substrate 35 in the second chassis 12. In FIG. 2, a configuration that two flexible substrates 38 are integrated with one vapor chamber 32 respectively and the respective flexible substrates 38 are connected to the display substrate 35 and the relay substrate 36 respectively is illustrated.

Incidentally, in the heat transport device 40, it is possible to connect the terminals 48 and 49 to the metal wiring 46 by applying several connection structures.

A first connection structure is illustrated as the configuration examples in FIG. 3A and FIG. 3B. In these configuration examples, full lengths of the second resin sheet 42 and the third resin sheet 43 are configured to become longer than a full length of the first resin sheet 41 such that the ends 38a and 38b of the flexible substrate 38 protrude in a longitudinal direction beyond the vapor chamber 32. Then, the terminals 48 and 49 are connected to the metal wiring 46 at the ends 38a and 38b of the flexible substrate 38. In other words, it may be also said that in the heat transport device 40 which is illustrated in the configuration examples in FIG. 3A and FIG. 3B, the vapor chamber 32 is formed by fixing an end of the first resin sheet 41 to a part of the second resin sheet 42 of the flexible substrate 38.

Figure 4:
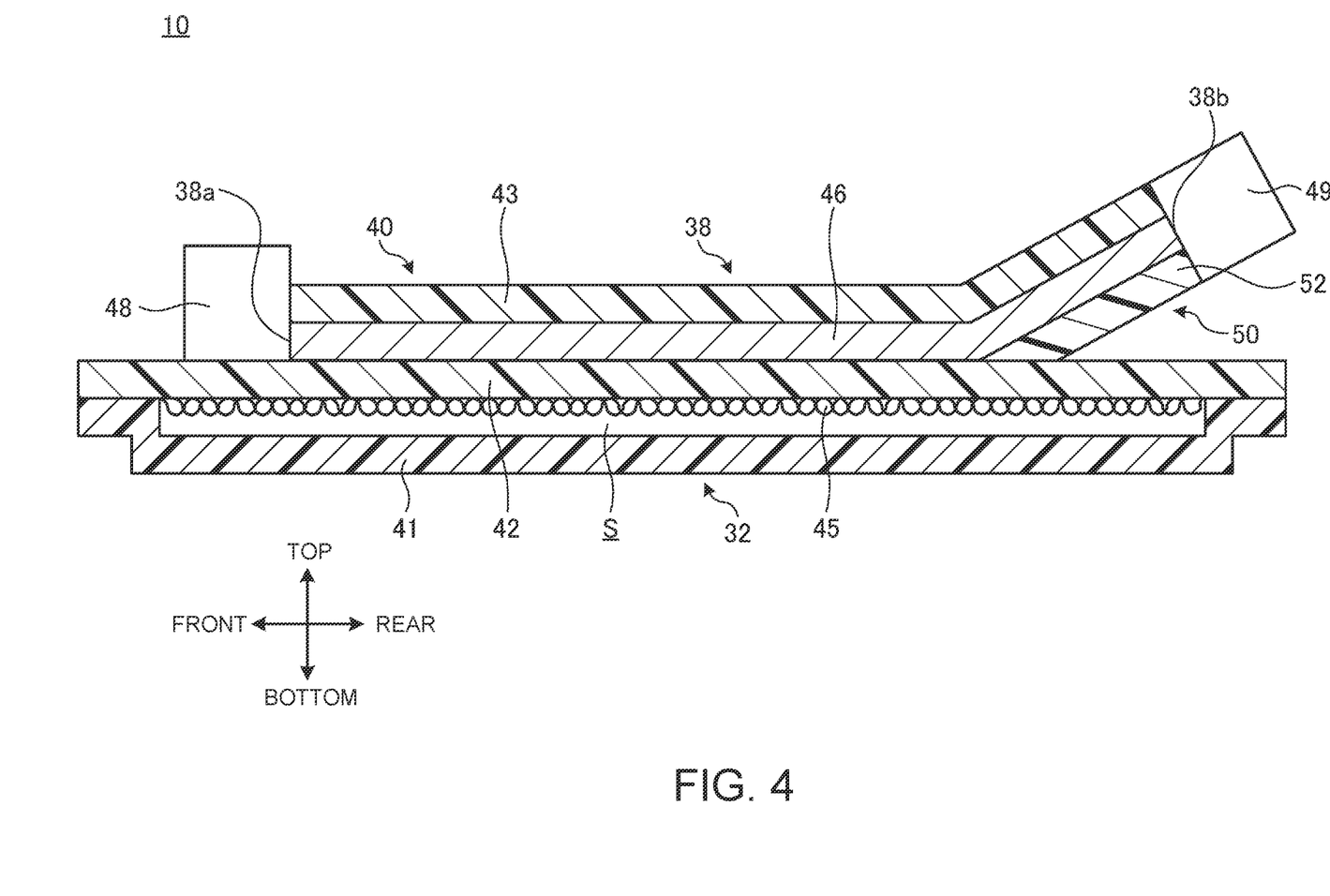
FIG. 4 is a schematic side sectional diagram illustrating one example of the heat transport device that a structure of attaching terminals to a flexible substrate according to a modified example is applied.

A second connection structure is as shown by the terminal 48 in the configuration example in FIG. 4. In this configuration example, the terminal passes through the third resin sheet 43 which constitutes the outermost layer of the flexible substrate 38 and is connected to the metal wiring 46. In other words, the heat transport device 40 in the configuration example in FIG. 4 has a configuration that the flexible substrate 38 is constructed on a part of the second resin sheet 42 of the vapor chamber 32 and the terminal 48 is directly attached to the flexible substrate 38.

A third connection structure is as shown by the terminal 49 in the configuration example in FIG. 4. In the configuration example in FIG. 4, the flexible substrate 38 has a branched part 50 which is branched such that a part of the flexible substrate 38 is separated from the vapor chamber 32. Specifically, the branched part 50 is formed by so branching the third resin sheet 43 and the metal wiring 46 as to separate from a surface of the second resin sheet 42 which is shared with the vapor chamber 32. The flexible substrate 38 in the configuration example in FIG. 4 has a fourth resin sheet 52 which is laminated under the third resin sheet 43 of the branched part 50 with the metal wiring 46 being interposed between the third resin sheet 43 and the fourth resin sheet 52. Then, in the flexible substrate 38, the terminal 49 is connected to the metal wiring 46 at the end 38b of the flexible terminal 38 which is located on the branched part 50. In other words, the heat transport device 40 which is illustrated in the configuration example in FIG. 4 has a configuration that the flexible substrate 38 is constructed on a part of the second resin sheet 42 of the vapor chamber 32 and the metal wiring 46 which is located on the branched part 50 which is not fixed to the vapor chamber 32 is covered with the fourth resin sheet 52. A direction that the branched part 50 branches off from the vapor chamber may be a left-right direction and a front-back direction, not limited to an up-down direction.

FIG. 4 illustrates the configuration that the second and third connection structures are simultaneously applied to one flexible substrate 38. However, it goes without saying that in the flexible substrate 38, the both terminals 48 and 49 may be configured by applying only the second or third connection structure. In addition, any one of the above-described first to third connection structures may be also applied to the both ends 38a and 38b of one flexible substrate 38 and the terminals 48 and 49 may be attached to the respective ends 38a and 38b of one flexible substrate 38 by applying mutually different connection structures. In a case where one flexible substrate 38 is branched to a plurality of parts, of course, the first to third connection structures may be appropriately applied to the respective parts.

As described above, the electronic apparatus 10 according to the first embodiment of the present invention includes the heat transport device 40 which is so installed as to extend from the chassis 11 to the chassis 12 and is formed by integrating the vapor chamber 32 with the flexible substrate 38. As illustrated in FIG. 4, the vaper chamber 32 has the first resin sheet 41 and the second resin sheet 42 which are flexible and the closed space S which is formed between the first and second resin sheets 41 and 42 and that the working fluid is encapsulated. Thereby, the vaper chamber 32 is formed into a thin sheet-like shape and thereby the vapor chamber 32 has flexibility as a whole. In addition, the flexible substrate 38 has the second resin sheet 42 and the third resin sheet 43 which is laminated on the second resin sheet 42 with the metal wiring 46 being interposed between the resin sheets 42 and 43. Then, the second resin sheet 42 is shared between the vapor chamber 32 and the flexible substrate 38.

Accordingly, it becomes possible for the electronic apparatus 10 to highly efficiently transport the heat that the CPU 22 which is implemented on the motherboard 20 generates in the first chassis 11 into the second chassis 12 which does not have a component which is involved in generation of a large amount of heat by the vapor chamber 32. Accordingly, it becomes possible for the electronic apparatus 10 to suppress occurrence of performance degradation of the CPU 22 which is induced by insufficient cooling of the CPU 22, partial formation of high-temperature portions (hot spots) on an outer face of the first chassis 11 and so forth.

On the other hand, it is preferable for the electronic apparatus 10 which is configured as described above to so install also the flexible substrate 38 which mutually connects individual electronic components which are installed in the first and second chassis 11 and 12 electrically such as, for example, the display substrate 35 and the relay substrate 36 (the display 34) as to extend from the first chassis 11 to the second chassis 12. However, in the electronic apparatus 10 such as, for example, the laptop PC and so forth, a space which is used for installation of a member which extends from the first chassis 11 to the second chassis 12 is limited. However, since the vapor chamber 32 is integrated with the flexible substrate 38, the total plate thickness of the heat transport device 40 is reduced. Therefore, it becomes possible to reduce the total thickness of the vapor chamber 32 and the flexible substrate 38 as much as possible in the heat transport device 40. Further, in the heat transport device 40, it becomes possible to readily install the vapor chamber 32 and the flexible substrate 38 which are so thinned as a whole on the same route and thereby space efficiency of the heat transport device 40 is improved. As a result, it becomes possible for the electronic apparatus 10 which includes the heat transport device 40 which is configured in this way to maintain thinning of the respective chassis 11 and 12 while mutually connecting the chassis 11 and 12 electrically and thermally. In addition, the heat transport device 40 makes it possible to reduce the material cost which is required for preparation of at least one resin sheet by sharing the second sheet 42 between the vapor chamber 32 and the flexible substrate 38.

In the heat transport device 40, it is preferable that the wick 45 of the vapor chamber 32 be arranged at a position which is closer to an inner face of the second resin sheet 42 than to an inner face of the first resin sheet 41 in the closed space S. Specifically, it is preferable that the wick 45 be installed on the side which is close to the flexible substrate 38 in the closed space S. In the closed space S of the vapor chamber 32, a high-temperature vapor-phase working fluid which evaporates and a comparatively low-temperature liquid-phase working fluid that the high-temperature vapor-phase working fluid condenses circulates and the low-temperature liquid-phase working fluid flows through the wick 45. Accordingly, in the heat transport device 40, in a case where the wick 45 is arranged on a face which is close to the flexible substrate 38, it becomes possible to suppress temperature rising of the flexible substrate 38 which is caused by heat transfer from the vapor chamber 32.

As illustrated in FIG. 2, the vapor chamber 32 in the first embodiment of the present invention may be also configured to cover the CPU 22 by increasing the area of a part of the vapor chamber 32 which is located ahead of the end 38a of the flexible substrate 38 in the first chassis 11. Thereby, heat transport performance and heat diffusion performance of the vapor chamber 32 are more improved. Also in the second chassis 12, the area of a part of the vapor chamber 32 which is located ahead of the end 38b of the of the flexible substrate 38 may be increased and thereby the vapor chamber 32 may be arranged on the rear-face side of the display 34. Alternatively, the vapor chamber 32 may be configured to dissipate heat by connecting the vapor chamber 32 directly to the second chassis 12 in the second chassis 12 and to dissipate heat by connecting the vapor chamber 32 to a copper sheet or the like which is installed on an inner face of the second chassis 12.

The heat transport device 40 may be also configured to install a part 40a which is bent into the S-shape in the first chassis 11 and thereby to absolve an excess length which generates at the time of mutual rotational movement between the chassis 11 and 12. The bent part 40a may be installed in the second chassis 12. However, considering from the viewpoint that it is easier to secure a height-direction space in the first chassis 11 than in the second chassis 12, it is preferable to install the bent part 40a in the first chassis 11.

Next, an electronic apparatus 10A according to the second embodiment of the present invention will be described.

Figure 5:
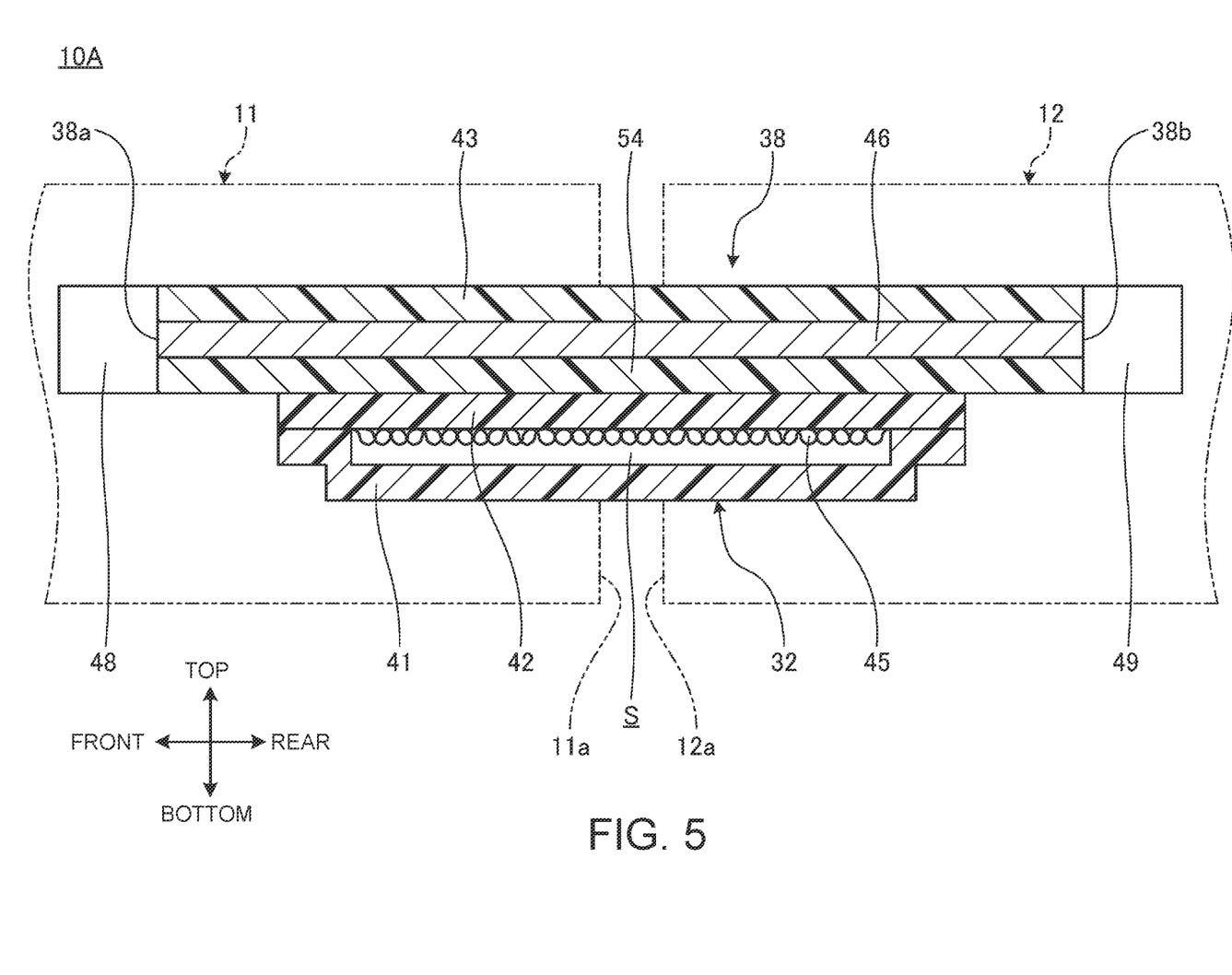
FIG. 5 is a schematic side sectional diagram illustrating one example of a vapor chamber and the flexible substrate in a state that an electronic apparatus according to the second embodiment of the present invention takes the 180-degree posture.

FIG. 5 is a schematic side sectional diagram illustrating one example of the vaper chamber 32 and the flexible substrate 38 in a state that the electronic apparatus 10A according to the second embodiment of the present invention takes the 180-degree posture. In FIG. 5, reference numerals which are the same as the reference numerals which are denoted in FIG. 1 to FIG. 4 indicate constitutional elements which are exactly the same as or almost the same as the constitutional elements in FIG. 1 to FIG. 4. For this reason, detailed description of the constitutional elements will be omitted for reasons that these constitutional elements exhibit functions and effects which are exactly the same as or almost the same as those of the constitutional elements in FIG. 1 to FIG. 4.

As illustrated in FIG. 5, the electronic apparatus 10A according to the second embodiment of the present invention does not use the heat transport device 40 that the vapor chamber 32 is integrated with the flexible substrate 38. That is, the electronic apparatus 10A has a configuration that the vapor chamber 32 and the flexible substrate 38 which are configured as separate elements are so installed as to extend from the chassis 11 to the chassis 12. Incidentally, other constitutional elements of the electronic apparatus 10A which is illustrated in FIG. 5 may be exactly the same as or almost the same as the constitutional elements of the electronic apparatus 10 which is illustrated in FIG. 1 to FIG. 4 except a point that the heat transport device 40 that the vapor chamber 32 is integrated with the flexible substrate 38 is not used.

In general, a vapor chamber has a high heat transfer coefficient in comparison with a heat transfer sheet such as a copper sheet, a graphite sheet and so forth and therefore it is possible for the vaper chamber to migrate and diffuse heat extremely rapidly. However, it is impossible for a vapor chamber which is generally used to withstand repetitive bending operations because of its structure that two metal sheets are laminated. For this reason, in the existing electronic apparatus, it is not expected to so install the vapor chamber as to extend from the chassis 11 to the chassis 12 which are coupled to be rotationally movable relative to each other as observed in the electronic apparatuses 10 and 10A.

However, the vapor chamber 32 in the present embodiment adopts a sheet structure that the resin sheets 41 and 42 which are made of, for example, polyimide are mutually laminated as described above. As a result, it becomes possible for the vapor chamber 32 to obtain the flexibility as a whole and to withstand the repetitive bending operations.

Accordingly, it becomes possible for the vapor chamber 32 which is described above not only to be configured to be integrated with the flexible substrate 38 as observed in the above-mentioned electronic apparatus 10 but also to be used separately from the flexible substrate 38 as observed in the electronic apparatus 10A which is illustrated in FIG. 5. As a result, also in the electronic apparatus 10A, it becomes possible to transport the heat which is generated in the first chassis 11 into the second chassis 12 highly efficiently with the aid of the flexible vapor chamber 32.

However, in the electronic apparatus 10A, two members, that is, the vapor chamber 32 and the flexible substrate 38 are so installed as to extend from the chassis 11 to the chassis 12 respectively. Accordingly, in the electronic apparatus 10A, there are also cases where it is preferable to secure a somewhat large space between the adjacent edges 11a and 12a of the chassis 11 and 12 in comparison with the above-described electronic apparatus 10. However, the usability of the electronic apparatus 10A is sufficiently high, for example, in a model that the restriction which is imposed on thinning of the chassis 11 and 12 is rather lax, a model that the chassis 11 and 12 are mutually connected electrically by using a thin code and so forth in place of the flexible substrate 38 and so forth.

In the electronic apparatus 10A, it is preferable that one face of the metal wiring 46 of the flexible substrate 38 be covered with a fifth resin sheet 54 in place of the second resin sheet 42 which is illustrated in FIG. 3A. That is, in this case, the flexible substrate 38 may have the configuration which is exactly the same as or almost the same as the configuration of a flexible substrate which is generally used. Also, the fifth resin sheet 54 may be formed by using a resin material which is exactly the same as or almost the same as the resin material of the resin sheets 41 to 43. As described above, in a case where the vapor chamber 32 is used together with the flexible substrate in the electronic apparatus 10A, it is preferable to mutually laminate the vapor chamber 32 and the flexible substrate 38, for example, as illustrated in FIG. 5. Thereby, also in the electronic apparatus 10A, it becomes possible to minimize the space which is necessary in the left-right direction between the adjacent edges 11a and 11b also in the electronic apparatus 10A.

Incidentally, it goes without saying the present invention is not limited to the above-described embodiments and it is possible to freely change the configuration within a range not deviating from the gist of the present invention.

DESCRIPTION OF SYMBOLS 10, 10A electronic apparatus
11 first chassis
12 second chassis
16 hinge
22 CPU
24 cooling device
32 vapor chamber
34 display
35 display substrate
36 relay substrate
38 flexible substrate
40 heat transport device (wiring)
41 first resin sheet
42 second resin sheet
43 third resin sheet
45 wick
46 metal wiring
48, 49 terminal
50 branched part
52 fourth resin sheet

What is claimed:

1. An electronic apparatus comprising: a first chassis which loads a processing device; a second chassis which is coupled with the first chassis to be rotatably movable relative to each other; a vapor chamber which has a first flexible resin sheet, a second flexible resin sheet and a closed space which is formed between the first flexible resin sheet and the second flexible resin sheet and in which a working fluid is encapsulated, extends from inside of the first chassis to inside of the second chassis and transports heat that the processing device generates to the second chassis; and a flexible substrate which extends from the inside of the first chassis to the inside of the second chassis, wherein the flexible substrate has the second flexible resin sheet and a third resin sheet which is laminated on the second flexible resin sheet with metal wiring being interposed between the second flexible resin sheet and the third resin sheet and is configured to be integrated with the vapor chamber by sharing the second flexible resin sheet with the vapor chamber, the first flexible resin sheet, the second flexible resin sheet and the third resin sheet are made of polyimide, full lengths of the second flexible resin sheet and the third resin sheet are configured to be longer than a full length of the first flexible resin sheet and thereby an end of the flexible substrate is so arranged as to protrude from the vapor chamber, and a terminal is attached to the end of the flexible substrate.

2. The electronic apparatus according to claim 1, wherein
the flexible substrate connects a first electronic component and a second electronic component together,
the first chassis loads the first electronic component, and
the second chassis loads the second electronic component.

3. A heat transport device comprising:
a vapor chamber which has a first flexible resin sheet, a second flexible resin sheet and a closed space which is formed between the first flexible resin sheet and the second flexible resin sheet and in which a working fluid is encapsulated; and
a flexible substrate which has the second flexible resin sheet and a third resin sheet which is laminated on the second flexible resin sheet with metal wiring being interposed between the second flexible resin sheet and the third resin sheet and which is configured to be integrated with the vapor chamber by sharing the second flexible resin sheet with the vapor chamber,
wherein
the first flexible resin sheet, the second flexible resin sheet and the third resin sheet are made of polyimide,
full lengths of the second flexible resin sheet and the third resin sheet are configured to be longer than a full length of the first flexible resin sheet and thereby an end of the flexible substrate is so arranged as to protrude from the vapor chamber, and
a terminal is attached to the end of the flexible substrate.

4. The heat transport device according to claim 3, wherein the terminal extends through the third resin sheet and is connected to the metal wiring.

5. The heat transport device according to claim 3, wherein the flexible substrate has
a branched part which is branched in such a manner that the third resin sheet and the metal wiring are partially separated from a surface of the second flexible resin sheet and
a fourth resin sheet which is laminated on the third resin sheet with the metal wiring being interposed between the third and the fourth resin sheets on the branched part, and
the terminal is attached to an end of the branched part of the flexible substrate.

6. The heat transport device according to claim 3, wherein the vapor chamber further has a wick which is housed in the closed space and has flexibility and
the wick is arranged at a position which is closer to an inner face of the second flexible resin sheet than to an inner face of the first flexible resin sheet.

* * * * *